United States Patent
Watanabe

(10) Patent No.: US 6,355,978 B1
(45) Date of Patent: Mar. 12, 2002

(54) PACKAGE FOR ACCOMMODATING ELECTRONIC PARTS, SEMICONDUCTOR DEVICE AND METHOD FOR MANUFACTURING PACKAGE

(75) Inventor: Masaki Watanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/484,024

(22) Filed: Jan. 18, 2000

(30) Foreign Application Priority Data

Jul. 19, 1999 (JP) ............................ 11-204930

(51) Int. Cl.[7] .............. H01L 23/14; H01L 23/12
(52) U.S. Cl. ............ 257/700; 257/691; 257/713; 257/738; 257/753
(58) Field of Search ................ 257/691, 700, 257/713, 737, 738, 753

(56) References Cited

U.S. PATENT DOCUMENTS 5,491,301 A * 2/1996 Akiba et al. ............ 174/250
5,508,556 A * 4/1996 Lin ......................... 257/691
5,831,333 A * 11/1998 Malladi et al. .......... 257/712

FOREIGN PATENT DOCUMENTS

| JP | 5-144953 | | 6/1993 | | |
|----|----------|---|--------|---|---|
| JP | 9-55447  | | 2/1997 | | |
| JP | 9-289261 | | 11/1997 | | |
| JP | 10-256420 | | 9/1998 | | |
| JP | 2000-133745 A | * | 5/2000 | ............ | H01L/23/12 |

* cited by examiner

Primary Examiner—Allan R. Wilson
(74) Attorney, Agent, or Firm—McDermott, Will & Emery

(57) ABSTRACT

A package for accommodating electronic parts intended for inhibiting the variation of the characteristic impedance of signal lines, electrical coupling between signal lines, crosstalk noise, and ground bounce, and a method for manufacturing such a semiconductor device and package. In a case-type BGA using a buildup substrate 2, the buildup substrate 2 and a stiffener 3 are adhered with a conductive adhesive layer 27 using a conductive adhesive, and a grounding plane 12 is constituted using said stiffener 3 and said buildup substrate 2.

12 Claims, 4 Drawing Sheets

PACKAGE FOR ACCOMMODATING ELECTRONIC PARTS, SEMICONDUCTOR DEVICE AND METHOD FOR MANUFACTURING PACKAGE

BACKGROUND OF THE INVENTION

1. Field of the Invention

The present invention relates to a package for accommodating electronic parts intended for inhibiting the variation of characteristic impedance of signal lines, electrical coupling between signal lines, crosstalk noise, and ground bounce, and to a method for manufacturing semiconductor devices and packages.

2. Description of Related Art

FIG. 4 is a sectional view of a semiconductor device illustrating an example of conventional semiconductor devices, and FIG. 5 is a plan of the semiconductor device shown in FIG. 4. In FIG. 4, 1 is a semiconductor chip, 2 is a buildup substrate, 3 is a stiffener, 4 is a first adhesive, 5 is a second adhesive, 6 is a heat spreader, 7 is a solder ball, 8 is a bump, 9 is an under-fill resin, and 10 is a heat conducting resin. Referring to FIGS. 4 and 5, a conventional semiconductor device has a ball-grid-array structure (case-type BGA), in which a semiconductor chip 1 is installed on a buildup substrate 2 composed of an organic material through a bump 8 as FIG. 4 shows, then the vicinity of the bottom of the semiconductor chip 1 is fixed to the central portion of the buildup substrate 2 using an under-fill resin 9 (see FIG. 5), the semiconductor chip 1 is sealed together with a metal stiffener 3 and a heat spreader 6 with a first adhesive 4 and a second adhesive 5, and bumps 8 and solder balls 7 are attached.

FIG. 6 is an enlarged sectional view of the semiconductor device of FIG. 4, and FIG. 7 is a pattern diagram of the semiconductor device of FIG. 4. In FIG. 6, 11 is a signal line, 12 is a ground plane, 13 is a core through hole, 14 is a buildup via, 15 is a core insulating layer, 16 is a first core interconnecting layer, 17 is a second core interconnecting layer, 18 is a first buildup insulating layer, 19 is a second buildup insulating layer, 20 is a first buildup interconnecting layer, 21 is a second buildup interconnecting layer, 22 is a first solder resist, 23 is a second solder resist, 24 is the thickness of the first adhesive, 25 is the thickness of the first solder resist, and 26 is the thickness of the first buildup insulating layer. Referring to FIGS. 6 and 7, the buildup substrate 2 comprises core insulating members such as the core insulating layer 15; core conductor layers such as the core through hole 13, the first core interconnecting layer 16, and the second core interconnecting layer 17 (see FIG. 7); buildup insulating layers such as the first buildup insulating layer 18, (having the thickness 26), and the second buildup insulating layer 19; buildup conductor layers in which the buildup via 14, the first buildup interconnecting layer 20, and the second buildup interconnecting layer 21 are densely formed (see FIG. 7); solder resists such as the first solder resist 22 (having the thickness 25) and the second solder resist 23; and a solder resist opening. The first solder resist 22 is adhered to the stiffener with the first adhesive 4 (having the thickness 24), and the ground plane 12 is mainly formed on the core conductor layer and the pattern of the signal line 11 is mainly formed on the buildup conductor layer.

However, in a conventional case-type BGA structure using a buildup substrate 2 of a 4-layer structure, the ground plane 12 has a pattern having a large opening due to the through-holes of core layer (core through-hole 13), and the following problems in electrical properties arise. The first problem is that the variation of characteristic impedance of interconnections is large when the interconnection lies on the ground plane 12, and when the interconnection lies on the through hole of the core layer (core through hole 13). The second problem is that crosstalk noise is increased especially when the interconnection lies on the through hole of the core layer (core through hole 13). The third problem is that since the pattern of the ground plane 12 has a large opening, the inductance of the ground plane 12 is increases, resulting in a large ground bounce.

SUMMARY OF THE INVENTION

In order to solve the above-described problems, the object of the present invention is to provide a package for accommodating electronic parts intended for inhibiting the variation of characteristic impedance of signal lines, electrical coupling between signal lines, crosstalk noise, and ground bounce, and to a method for manufacturing semiconductor devices and packages.

According to a first aspect of the present invention, there is provided a package for accommodating electronic parts, comprising: a structure, wherein a buildup substrate having a power source and/or a ground layer formed on a core substrate, and signal lines formed on a buildup interconnecting layer is adhered to a stiffener with a conductive adhesive layer using a conductive adhesive, and a grounding plane is formed using the stiffener and the buildup substrate.

According to a second aspect of the present invention, there is provided a semiconductor device, comprising: a grid-array structure, wherein a buildup substrate having a power source and/or a ground layer formed on a core substrate, and signal lines formed on a buildup interconnecting layer is adhered to a stiffener with a conductive adhesive layer using a conductive adhesive, and a grounding plane is formed using the stiffener and the buildup substrate, after a semiconductor chip has been installed on the buildup substrate through a bump, the vicinity of the bottom of the semiconductor chip is fixed on the central portion of the buildup substrate with under-fill resin, the semiconductor chip is sealed with the stiffener and the conductive adhesive layer, and a solder ball is fixed to the bump.

According to a third aspect of the present invention, there is provided a method for manufacturing a package for accommodating electronic parts, comprising the steps of: adhering a buildup substrate having a power source and/or a ground layer formed on a core substrate, and signal lines formed on a buildup interconnecting layer to a stiffener with a conductive adhesive layer using a conductive adhesive; and forming a grounding plane using the stiffener and the buildup substrate.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
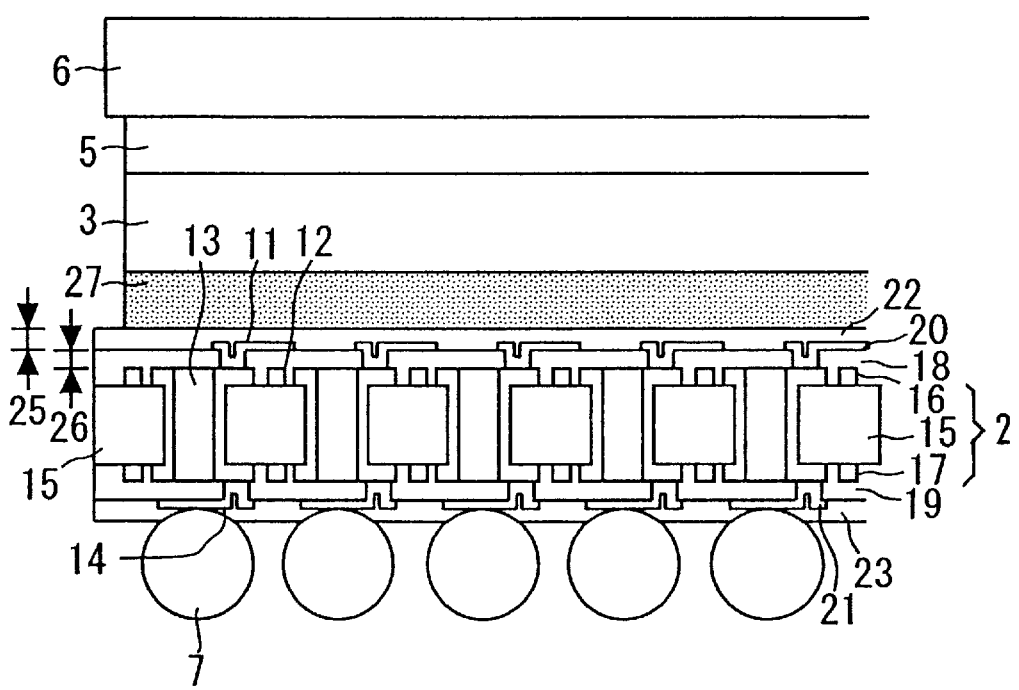
FIG. 1 is a sectional view of a semiconductor device according to the Embodiment 1 of the present invention.

Embodiments of the present invention will be described below with reference to the accompanying drawings. It is noted that the same reference symbols in the drawings denote the same or corresponding components.

Embodiment 1

Figure 4:
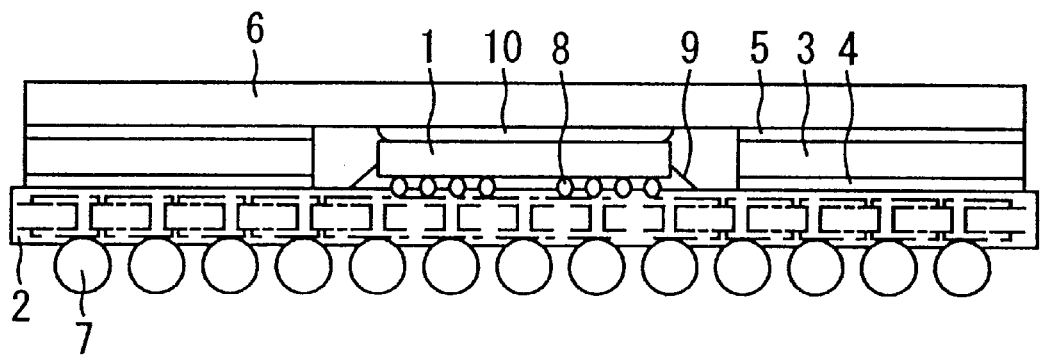
FIG. 4 is a sectional view of a semiconductor device illustrating an example of conventional semiconductor devices.
Figure 5:
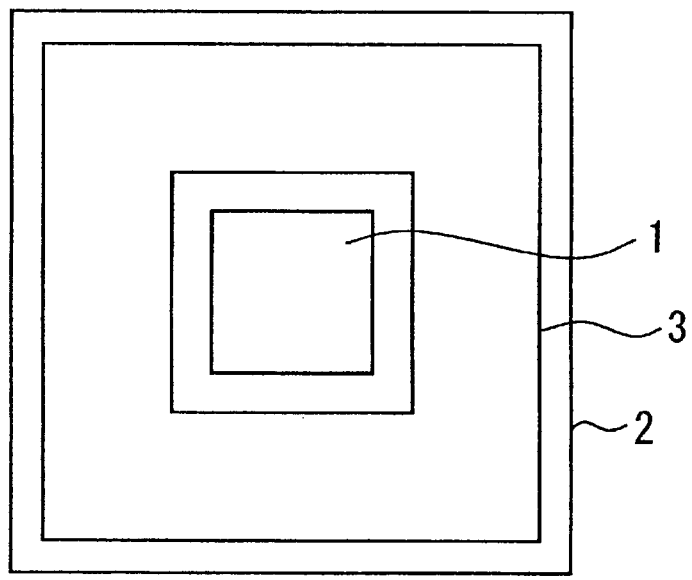
FIG. 5 is a plan of the semiconductor device shown in FIG. 4.
Figure 6:
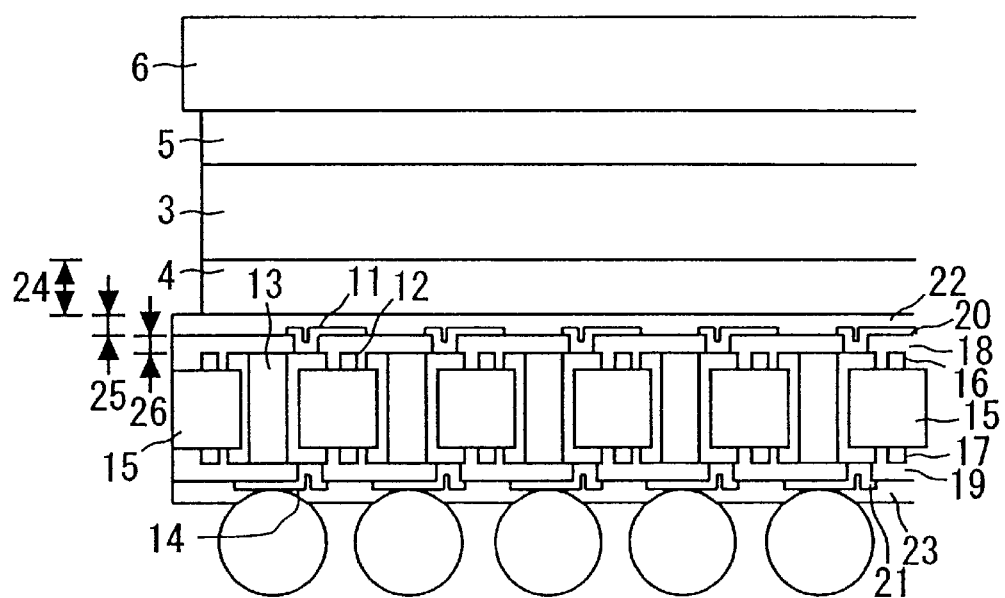
FIG. 6 is an enlarged sectional view of the semiconductor device of FIG. 4.
Figure 7:
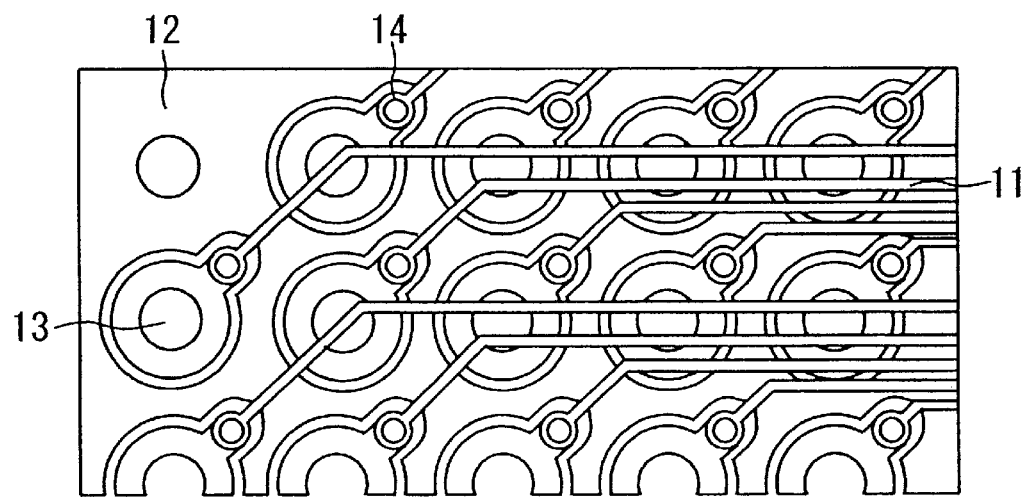
FIG. 7 is a pattern diagram of the semiconductor device of FIG. 4.

The Embodiment 1 of the present invention will be described in detail below referring to the drawings. FIG. 1 is a sectional view of a semiconductor device according to the Embodiment 1 of the present invention. In FIG. 1, 2 is a buildup substrate, 3 is a stiffener, 5 is a second adhesive, 6 is a heat spreader, 7 is a solder ball, 11 is a signal line, 12 is a ground plane, 13 is a core through hole, 14 is a buildup via, 15 is a core insulating layer, 16 is a first core interconnecting layer, 17 is a second core interconnecting layer, 18 is a first buildup insulating layer, 19 is a second buildup insulating layer, 20 is a first buildup interconnecting layer, 21 is a second buildup interconnecting layer, 22 is a first solder resist, 23 is a second solder resist, 25 is the thickness of the first solder resist, 26 is the thickness of the first buildup insulating layer, and 27 is a conductive adhesive layer. Referring to FIGS. 1, 4, and 5, a conventional semiconductor device has a ball-grid-array structure (case-type BGA), in which a semiconductor chip 1 (see FIG. 4) is installed on a buildup substrate 2 composed of an organic material through a bump 8 as FIG. 1 shows, then the vicinity of the bottom of the semiconductor chip 1 (see FIG. 4) is fixed to the central portion of the buildup substrate 2 using an under-fill resin 9 (see FIG. 5), the semiconductor chip 1 (see FIG. 4) is sealed together with a metal stiffener 3 and a heat spreader 6 with a first adhesive 4 and a second adhesive 5, and bumps 8 (see FIG. 4) and solder balls 7 are attached.

The buildup substrate 2 comprises core insulating members such as the core insulating layer 15; core conductor layers such as the core through hole 13, the first core interconnecting layer 16, and the second core interconnecting layer 17; buildup insulating layers such as the first buildup insulating layer 18, (having the thickness 26), and the second buildup insulating layer 19; buildup conductor layers in which the buildup via 14, the first buildup interconnecting layer 20, and the second buildup interconnecting layer 21 are densely formed; solder resists such as the first solder resist 22 (having the thickness 25) and the second solder resist; and a solder resist opening. The first solder resist 22 is adhered to the stiffener with the first adhesive 4 and the second adhesive 5, and the ground plane 12 is mainly formed on the core conductor layer and the pattern of the signal line 11 is mainly formed on the buildup conductor layer.

This embodiment is characterized in that in place of the first adhesive 4, a conductive adhesive layer 27 consisting mainly of a conductive adhesive is used as the ground for the signal line 11. In prior art, on the other hand, since the distance between the signal line 11 and the stiffener 3, that is the thickness of the first solder resist 22 and the first adhesive 4 (having the thickness 24) is larger than the distance between the signal line 11 and the ground plane 12, that is the thickness of the first buildup insulating layer 18, the stiffener 3 cannot be used as the ground for the signal line 11.

In this embodiment, since the first solder resist 22 (having the thickness 25) is thinner than the first buildup insulating layer 18 (having the thickness 26), the conductive adhesive layer 27 consisting mainly of an adhesive having an even conductivity is dominant over the ground pattern using the uneven first core interconnecting layer 16 as the ground for the signal line 11. Although the conductive adhesive layer 27 consisting mainly of a conductive adhesive is in a floating state, the grounding effect is obtained by eddy currents, and the effect of decreasing the variation of the characteristic impedance of the signal line 11 can be obtained. Also, although crosstalk noise tends to increase because the density of the signal line 11 of the first buildup insulating layer 18 is high, the ground approaches to the signal line 11, and the effect of decreasing the electrical coupling between signal lines 11, and minimizing crosstalk noise can be obtained.

Embodiment 2

Figure 2:
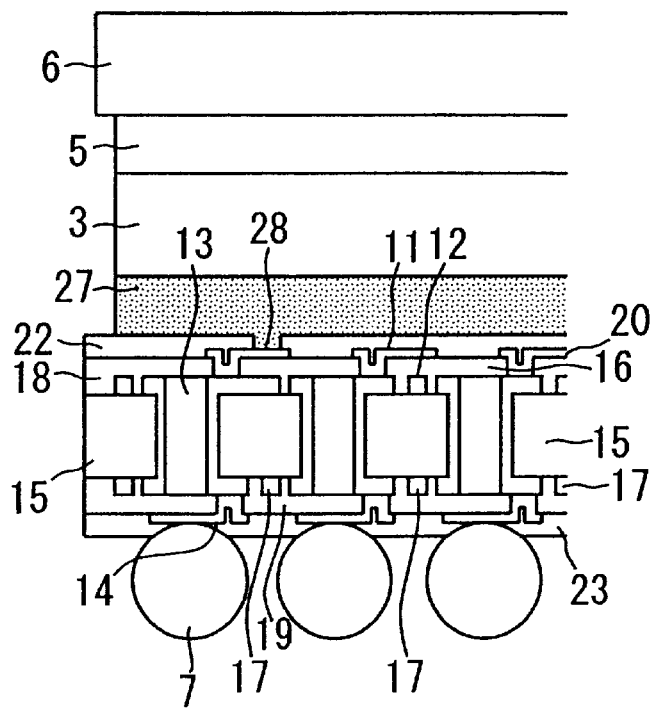
FIG. 2 is a sectional view of a semiconductor device according to the Embodiment 2 of the present invention.
Figure 3:
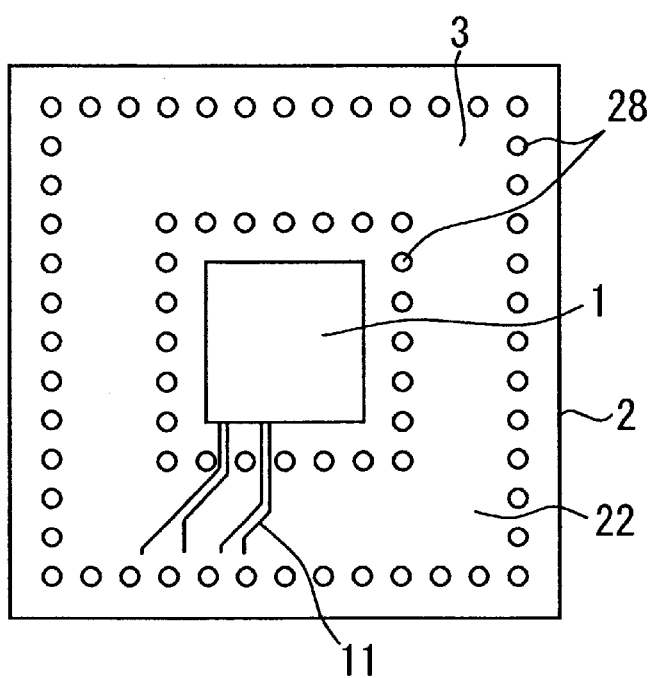
FIG. 3 is a plan of the semiconductor device of FIG. 2.

The Embodiment 2 of the present invention will be described in detail below referring to the drawings. FIG. 2 is a sectional view of a semiconductor device according to the Embodiment 2 of the present invention, and FIG. 3 is a plan of the semiconductor device of FIG. 2. The same parts already described in the Embodiment 1 are indicated by the same symbols, and are not doubly described here. In FIG. 2, 28 indicates ground connecting pads. Referring to FIGS. 2 and 3, this embodiment is characterized in that a plurality of ground connecting pads 28 as shown in FIG. 3 are provided on the first solder resist 22 and the first buildup interconnecting layer 20, and in having a structure for connecting a conductive adhesive layer 27 consisting mainly of a conductive adhesive described in the Embodiment 1 to a plurality of ground connecting pads 28.

As described in the Embodiment 1, the effect of the conductive adhesive layer 27 consisting mainly of a conductive adhesive to be the ground is mainly caused by the eddy current. In this embodiment, a return path of the current can be provided to the conductive adhesive layer 27 consisting mainly of a conductive adhesive by connecting the conductive adhesive layer 27 consisting mainly of a conductive adhesive to a plurality of ground connecting pads 28. This embodiment has the advantages of reducing the variation of characteristic impedance of the signal lines 11 compared with the Embodiment 1, reducing electrical coupling between the signal lines 11 compared with the Embodiment 1, and reducing crosstalk noise compared with the Embodiment 1. Furthermore, since the number of current paths of the ground increases, the impedance of the ground can be minimized resulting in the reduction of ground bounce.

It is obvious that the present invention is not limited to the above-described embodiments, and that each of the embodiments can be altered as required within the scope of the technical concept of the present invention. Also, the number, location and shape of the above-described constituting members are not limited to those in the above embodiments, but any number, location and shape suitable for carrying out the present invention can be selected. In the drawings, the same symbols are used for indicating the same constituting members.

Since the present invention is constituted as described above, the variation of the characteristic impedance can be minimized. The reason is that since the thickness of the first solder resist (first solder-resist thickness) is smaller than the thickness of the first buildup insulating layer (first buildup-insulating-layer thickness), the ground for the signal lines of the adhesive of even conductivity (conductive adhesive layer) is more dominant than the ground pattern using the uneven first core interconnecting layer, and although the adhesive of even conductivity (conductive adhesive layer) is in the floating state, the effect of the ground is obtained by eddy currents. And an electrical coupling between signal lines can be reduced, and crosstalk noise can be minimized. The reason is that although the signal lines of the first buildup insulating layer tend to increase crosstalk noise because of high density, it is minimized by arranging the ground close to the signal lines.

Finally, ground bounce can be minimized. The reason is that since the number of current paths of the ground increase, the inductance of the ground can be decreased.

In the package for accommodating electronic parts, the package may be constituted so as to fix the conductive adhesive layer at a grounding potential.

Here, the package for accommodating electronic parts may further comprise pads connected to the grounding plane, the pads being provided on the surface of the buildup substrate and being electrically connected to the conductive adhesive layer.

Here, the package for accommodating electronic parts may further comprise a plurality of ground connecting pads, the pads being provided on the buildup interconnecting layer, and the conductive adhesive layer having mainly a conductive adhesive.

In the semiconductor device, the semiconductor device may be so constituted as to fix the conductive adhesive layer in the ball grid array structure at a grounding potential.

Here, the semiconductor device may further comprise pads connected to the grounding plane in the ball grid array structure, the pads being provided on the surface of the buildup substrate and being electrically connected to the conductive adhesive layer.

Here, the semiconductor device may further comprise a plurality of ground connecting pads being provided on the buildup interconnecting layer in the ball grid array structure, and the conductive adhesive layer having mainly a conductive adhesive is connected to the plurality of ground connecting pads.

Here, the method for manufacturing a package for accommodating electronic parts may further comprise the step of fixing the conductive adhesive layer at a grounding potential.

Here, the method for manufacturing a package for accommodating electronic parts may further comprise the step of providing pads connected to the grounding plane on the surface of the buildup substrate as well as electrically connecting the pads to the conductive adhesive layer.

Here, the method for manufacturing a package for accommodating electronic parts may further comprise the steps of providing a plurality of ground connecting pads on the buildup interconnecting layer; and connecting the conductive adhesive layer having mainly a conductive adhesive to the plurality of ground connecting pads.

According to a fourth aspect of the present invention, there is provided a method for manufacturing a package for accommodating electronic parts, comprising the steps of: adhering a buildup substrate having a power source and/or a ground layer formed on a core substrate, and signal lines formed on a buildup interconnecting layer to a stiffener with a conductive adhesive layer using a conductive adhesive, forming a grounding plane using the stiffener and the buildup substrate, installing a semiconductor chip on the buildup substrate through bumps and fixing the vicinity of the bottom of the semiconductor chip on the central portion of the buildup substrate with an under-fill resin; sealing the semiconductor chip with the stiffener and the conductive adhesive layer; and forming a ball grid array structure by fixing solder balls to the bumps.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-204930 filed on Jul. 19, 1999 including specification, claims, drawings and summary are incorporated herein by reference in its entirety.

What is claimed is:

1. A package for accommodating electronic parts, comprising:
   a core substrate;
   a buildup substrate having a power source and/or a ground layer formed on said core substrate;
   a buildup interconnecting layer connected to said buildup substrate;
   signal lines formed on said buildup interconnecting layer;
   a conductive adhesive layer formed over said signal lines; and
   a stiffener,
   wherein the stiffener is adhered to said signal lines with said conductive adhesive layer using a conductive adhesive, and
   a grounding plane is formed using said stiffener and said buildup substrate.

2. The package for accommodating electronic parts according to claim 1, wherein said package is constituted so as to fix said conductive adhesive layer at a grounding potential.

3. The package for accommodating electronic parts according to claim 2, further comprising a plurality of ground connecting pads, said pads being provided on said buildup interconnecting layer, and said conductive adhesive layer having mainly a conductive adhesive.

4. The package for accommodating electronic parts according to claim 1, further comprising pads connected to said grounding plane, said pads being provided on the surface of said buildup substrate and being electrically connected to said conductive adhesive layer.

5. The package for accommodating electronic parts according to claim 4, further comprising a plurality of ground connecting pads, said pads being provided on said buildup interconnecting layer, and said conductive adhesive layer having mainly a conductive adhesive.

6. The package for accommodating electronic parts according to claim 1, further comprising a plurality of ground connecting pads, said pads being provided on said buildup interconnecting layer, and said conductive adhesive layer having mainly a conductive adhesive.

7. A semiconductor device comprising:
   a grid-array structure including
      a core substrate,
      a buildup substrate having a power source and/or a ground layer formed on said core substrate,
      a buildup interconnecting layer connected to said building substrate,
      signal lines formed on said buildup interconnecting layer,
      a conductive adhesive layer formed over said signal lines, and a stiffener,
wherein the stiffener is adhered to said signal lines with said conductive adhesive layer using a conductive adhesive, and
a grounding plane is formed using said stiffener and said buildup substrate;
a bump
a semiconductor chip installed on said buildup substrate through said bump, the vicinity of the bottom of said semiconductor chip is fixed on the central portion of said buildup substrate with under-fill resin, said semiconductor chip is sealed with said stiffener and said conductive adhesive layer, and a solder ball is fixed to said bump.

8. The semiconductor device according to claim 7, wherein said semiconductor device is so constituted as to fix said conductive adhesive layer in said ball grid array structure at a grounding potential.

9. The semiconductor device according to claim 8, further comprising a plurality of ground connecting pads being provided on said buildup interconnecting layer in said ball grid array structure, and said conductive adhesive layer having mainly a conductive adhesive is connected to said plurality of ground connecting pads.

10. The semiconductor device according to claim 7, further comprising pads connected to said grounding plane in said ball grid array structure, said pads being provided on the surface of said buildup substrate and being electrically connected to said conductive adhesive layer.

11. The semiconductor device according to claim 10, further comprising a plurality of ground connecting pads being provided on said buildup interconnecting layer in said ball grid array structure, and said conductive adhesive layer having mainly a conductive adhesive is connected to said plurality of ground connecting pads.

12. The semiconductor device according to claim 7, further comprising a plurality of ground connecting pads being provided on said buildup interconnecting layer in said ball grid array structure, and said conductive adhesive layer having mainly a conductive adhesive is connected to said plurality of ground connecting pads.

* * * * *